(12) United States Patent
Melvin, III (10) Patent No.: US 7,973,909 B2
(45) Date of Patent: Jul. 5, 2011

(54) METHOD AND APPARATUS FOR USING A SYNCHROTRON AS A SOURCE IN EXTREME ULTRAVIOLET LITHOGRAPHY

(75) Inventor: Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 288 days.

(21) Appl. No.: 12/251,198

(22) Filed: Oct. 14, 2008

(65) Prior Publication Data

US 2010/0092880 A1     Apr. 15, 2010

(51) Int. Cl.
*G03B 27/72* (2006.01)
*G03B 27/42* (2006.01)

(52) U.S. Cl. ............................. 355/69; 355/53
(58) Field of Classification Search .................. 355/53, 355/67–71; 250/492.2, 492.22, 548
See application file for complete search history.

(56) References Cited

U.S. PATENT DOCUMENTS

| | | | |
|---|---|---|---|
| 5,444,758 A | | 8/1995 | Miyake |
| 5,512,759 A | * | 4/1996 | Sweatt ........................ 250/492.1 |
| 5,606,586 A | | 2/1997 | Amemiya |
| 6,335,786 B1 | * | 1/2002 | Shiraishi ........................ 355/67 |
| 6,449,332 B1 | * | 9/2002 | Chiba ............................ 378/34 |
| 6,700,644 B2 | * | 3/2004 | Sweatt ............................ 355/53 |
| 6,850,313 B2 | * | 2/2005 | Ishikawa et al. ................ 355/69 |

* cited by examiner

*Primary Examiner* — Hung Henry Nguyen
(74) *Attorney, Agent, or Firm* — Park, Vaughan, Fleming & Dowler LLP; Laxman Sahasrabuddhe (57) ABSTRACT

One embodiment of the present invention provides a method to facilitate using a synchrotron as a source in an extreme ultraviolet lithography (EUVL) system, wherein the synchrotron's energy decreases over time. The EUVL system can includes a stepper which uses a step-and-repeat process or a step-and-scan process to transfer patterns from a reticle onto a wafer. The wafer is desired to be exposed to a substantially constant dose. During operation, the system can measure a synchrotron current, and adjust the stepper's exposure duration or the stepper's scan speed based on the synchrotron current so that the wafer is exposed to the substantially constant dose. Note that using the synchrotron current to control the stepper can enable the EUVL system to expose the wafer to the substantially constant dose without using additional equipment to monitor the source's energy.

8 Claims, 5 Drawing Sheets

FIG. 6

METHOD AND APPARATUS FOR USING A SYNCHROTRON AS A SOURCE IN EXTREME ULTRAVIOLET LITHOGRAPHY

BACKGROUND

1. Field of the Invention

The present invention generally relates to semiconductor manufacturing and fabrication. More specifically, the present invention relates to methods and apparatuses for using a synchrotron as a source in extreme ultraviolet lithography.

2. Related Art

Rapid advances in computing technology have made it possible to perform trillions of computational operations each second on data sets that are sometimes as large as trillions of bytes. These advances can largely be attributed to the dramatic improvements in semiconductor manufacturing technologies which have made it possible to integrate tens of millions of devices onto a single chip.

Conventional photolithography processes are close to reaching their physical limit in terms of the minimum feature size that can be printed. Hence, the semiconductor industry is actively considering various next generation technologies which will enable feature sizes to be miniaturized even further. One of the more promising technologies is extreme ultraviolet lithography (EUVL) which uses approximately 13 nm light (hereinafter referred to as "13 nm" light).

Today's EUVL systems are not ready for mass-scale manufacturing because of serious technological problems with the illumination source, the photoresist, and the mask. The EUVL illumination source has two significant problems: power and reliability. The extreme ultraviolet sources that are being considered for use in EUVL are able to deliver 5-10 $mJ/mm^2$ to a wafer surface, with a slow throughput rate. Specifically, a commonly used source generates EUVL light by shooting a metallic tape or a gas with a laser, which causes a 13 nm pulse to be produced. However, the pulse rate is low and the process is not very clean, which causes this source to have a short lifetime and low power.

The photoresist problem in EUVL is also directly related to the problems with the source. First, most materials absorb 13 nm light, so penetrating deep (~100 nm) into photoresist is very difficult. Second, EUVL photoresist materials usually have significant contrast and line edge roughness problems, which means that the photoresist material has difficulty in distinguishing between the high and low portions of the optical transmission signal. Unfortunately, if the source has low power, it exacerbates both the contrast and line edge roughness problems.

Mass-scale manufacturing typically requires a throughput of 100 wafers per hour. However, the EUVL sources that the industry is currently considering result in a throughput of 10 wafers per hour, and are estimated to cost between $5 and $10 million per unit. Hence, EUVL systems that use these EUVL sources are most likely not going to be economically viable.

SUMMARY

Some embodiments of the present invention provide a system that enables a synchrotron to be used as a source in an extreme ultraviolet lithography process. A synchrotron is a reliable source for high power extreme ultraviolet radiation, and hence, it does not suffer from the problems that some other EUVL sources suffer from. However, the synchrotron source's energy decreases over time, which is a serious problem for mass-scale semiconductor manufacturing. Specifically, a synchrotron usually has a storage ring which stores circulating electrons. When the circulating electrons emit photons, the electrons lose energy, which causes the energy of the synchrotron radiation to decrease over time.

There are at least two types of steppers: those that use a step-and-repeat approach, and those that use a step-and-scan approach. Some embodiments of the present invention are directed to control the stepper's behavior so that all locations on the wafer receive a substantially constant dose in spite of the fact that the synchrotron source's energy decreases with time.

Specifically, some embodiments of the present invention adjust a step-and-repeat stepper's exposure duration to ensure that the wafer is exposed to a substantially constant dose. The circulating electrons in the synchrotron generate a current. The EUVL system can be calibrated to determine a proportionality constant that relates the dose, the synchrotron current, and the stepper's exposure duration. During operation, the synchrotron current can be measured and the stepper's exposure duration can be adjusted so that the wafer is exposed to a substantially constant dose.

Some embodiments of the present invention adjust the step-and-scan stepper's scan speed to ensure that the wafer is exposed to a substantially constant dose. The EUVL system can be calibrated to determine a proportionality constant that relates the dose, the synchrotron current, and the stepper's scan speed. During operation, the synchrotron current can be measured and the stepper's scan speed can be adjusted so that the wafer is exposed to a substantially constant dose.

Note that synchrotrons usually include equipment to monitor the synchrotron current. Hence, using the synchrotron current to adjust the stepper's exposure duration or the stepper's scan speed can obviate the need for additional monitoring equipment to monitor the energy of the extreme ultraviolet radiation.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design and Fabrication

Figure 1:
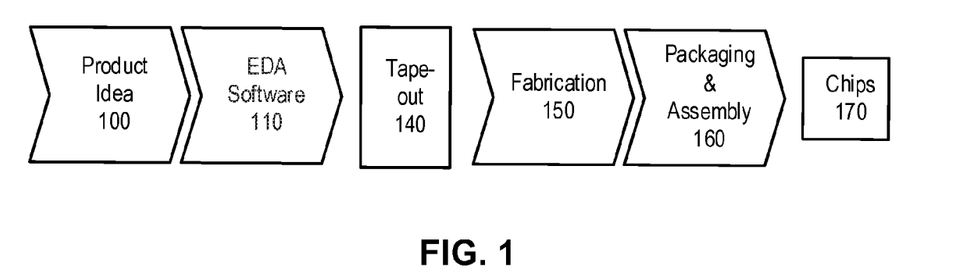
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170). One embodiment of the present invention can be used during the fabrication process (step 150).

Extreme Ultraviolet Lithography

Figure 2:
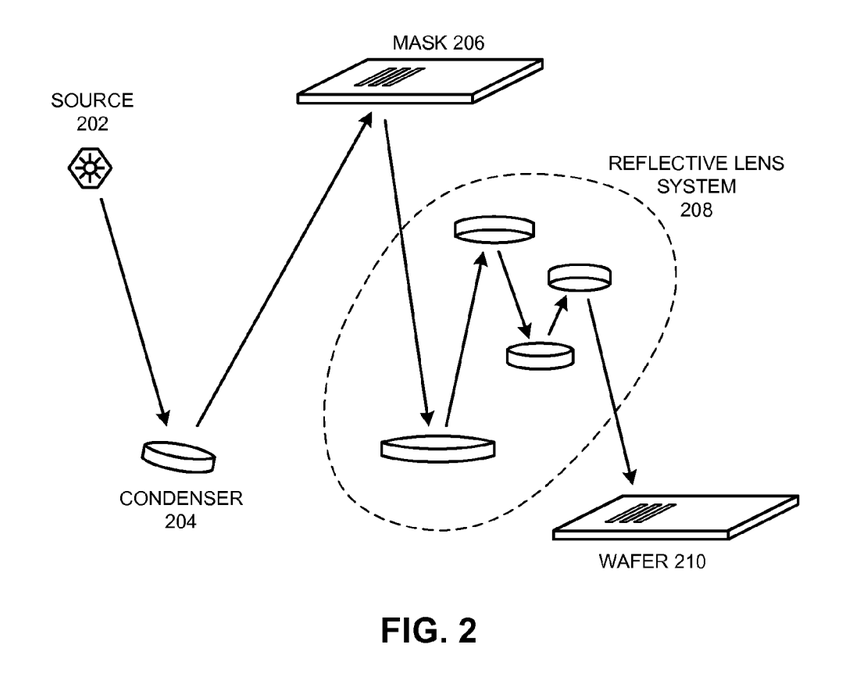
FIG. 2 illustrates a generic EUVL system in accordance with an embodiment of the present invention.

FIG. 2 illustrates an EUVL system in accordance with an embodiment of the present invention.

During photolithography, a pattern on a reticle or a mask is printed on a wafer. EUVL is a promising photolithography process for the manufacture of semiconductor chips beyond the 22 nm node. Radiation from source 202 can be focused and reflected by condenser 204. The light can then be reflected by mask 206, and by reflective lens system 208, before imaging on wafer 210. After the wafer is exposed, the patterns can be developed by subjecting the wafer to various chemical and physical processes.

Today's EUVL sources have serious power and reliability problems which is preventing EUVL systems from being used for mass-scale manufacturing. As mentioned above, the EUVL sources that are currently being used in EUVL systems deliver 5-10 mJ/mm$^2$ to a wafer surface, with a slow throughput rate. Specifically, a commonly used source generates EUVL light by shooting a metallic tape or a gas with a laser, which causes a 13 nm pulse to be produced. However, the pulse rate is low and the pulse generation process is not very clean, which causes this source to have a short lifetime and low power.

Synchrotron

One embodiment of the present invention uses a synchrotron as a source in the EUVL system. The synchrotron makes for a good source because it is reliable, and it can generate multiple high-power beams. However, using a synchrotron source in EUVL poses new challenges which must be overcome before a synchrotron can be used for mass-scale manufacturing.

A synchrotron is a particle accelerator in which the magnetic field and the electric field are carefully synchronized with the circulating charged particles within the synchrotron. A synchrotron is usually shaped like a polygon with rounded corners which contain bending magnets to bend the trajectory of the charged particles so that they continue to circulate in the synchrotron.

Charged particles emit photons when they are accelerated. Since the charged particles circulating in the synchrotron accelerate at every corner in the synchrotron, it enables the synchrotron to generate a large number of radiation beams. The frequency of the radiation beams is dependent on the particle charge and the acceleration that the particles undergo at each corner. Hence, the beam frequency can be controlled by controlling the acceleration of the charged particles.

At a typical synchrotron facility, electrons are accelerated by a synchrotron, and then injected into a storage ring. In the storage ring, the electrons generate radiation beams as they circulate, but the electrons do not gain any energy. In this type of facility, the beams may originate at the corners of the storage ring or in the straight sections of the storage ring with the use of insertion devices. Synchrotron technology is very well understood, and further details of the technology can be found in a number of books, e.g., E. J. N. Wilson, *An Introduction to Particle Accelerators*, Oxford University Press, 2001.

Synchrotron sources have been used in medicine, condensed matter physics, and material science. Synchrotron sources have also been used for semiconductor manufacturing in experimental settings, but they have not been used for mass-scale semiconductor manufacturing. One embodiment of the present invention provides systems and techniques for using a synchrotron as an EUVL source for mass-scale semiconductor manufacturing.

As mentioned above, a serious problem with the EUVL sources that are being used today is that their power is unacceptably low. For example, EUVL sources that are being used today deliver power in the 5-10 mJ/mm$^2$ range. In contrast, a synchrotron can easily generate multiple high-power radiation beams, each of which is capable of delivering 100s of mJ/mm$^2$ to the wafer's surface. Furthermore, unlike EUVL sources that are being used today, a synchrotron source does not have a short lifetime partly because the process that is used for generating the radiation is very clean.

Stepper

In mass-scale semiconductor manufacturing, a stepper is commonly used to expose the reticle. There are at least two types of steppers: those that use a step-and-repeat approach, and those that use a step-and-scan approach.

A step-and-repeat stepper exposes the entire reticle onto a region of the mask, and then "steps" to a new location so that it can expose the reticle again at the new location. In this manner, the step-and-repeat stepper creates multiple copies of the reticle's patterns on the wafer. The dosage received at any point on the wafer is directly proportional to the intensity of the light source and is also directly proportional to the exposure duration.

Figure 3A:
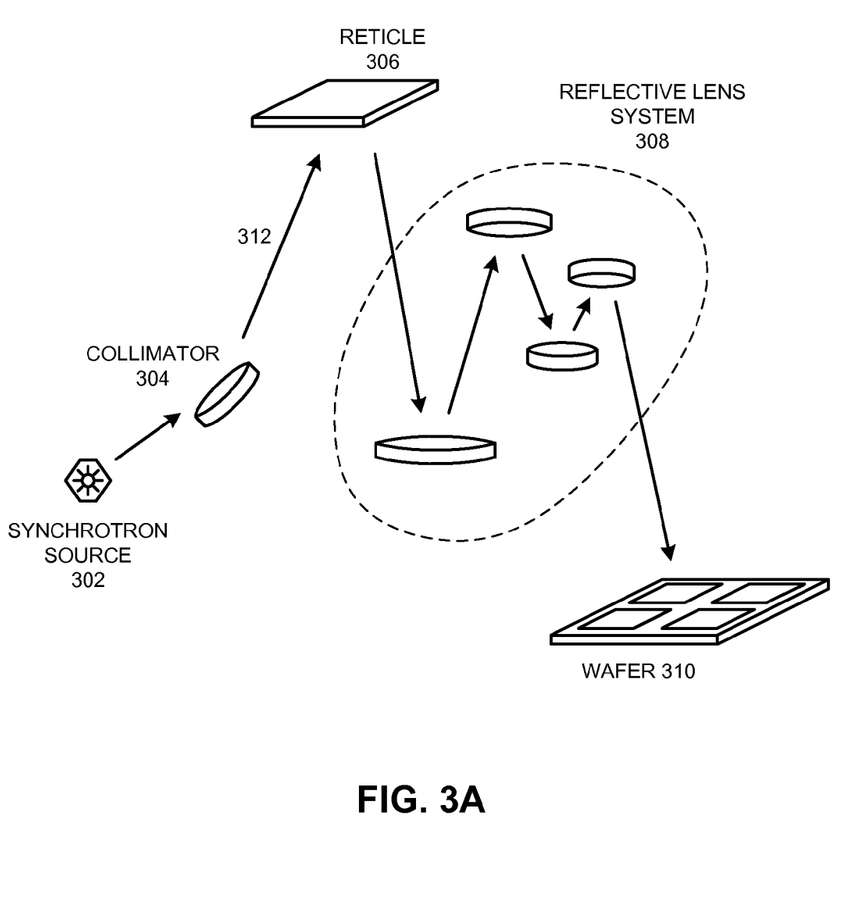
FIG. 3A illustrates an EUVL system which includes a synchrotron source and a step-and-repeat stepper in accordance with an embodiment of the present invention.

FIG. 3A illustrates an EUVL system which includes a synchrotron source and a step-and-repeat stepper in accordance with an embodiment of the present invention.

Radiation from source 302 can be focused and collimated into a square-shaped beam 312 by collimator 304. The light can then be reflected by reticle 306, and by reflective lens system 308, before imaging on wafer 310. Note that the beam remains square shaped till it images on the wafer.

As mentioned above, the step-and-repeat stepper exposes the entire wafer at multiple locations on the wafer (the exposed regions on wafer 310 are shown as squares). In a step-and-repeat stepper, the reticle and the wafer are stationary during exposure.

The step-and-repeat approach can limit the resolution that can be achieved during photolithography. In contrast to a step-and-repeat stepper, a step-and-scan stepper exposes only a part of the wafer at a time, which allows the system to print smaller feature sizes. Like the step-and-repeat stepper, the step-and-scan stepper exposes a region of the wafer and then moves or "steps" to a new location on the wafer. However, unlike the step-and-repeat stepper, the step-and-scan stepper performs the exposure by scanning the reticle, i.e., by exposing the reticle using an intense flat beam of light that projects a thin section of the reticle onto the wafer.

Figure 3B:
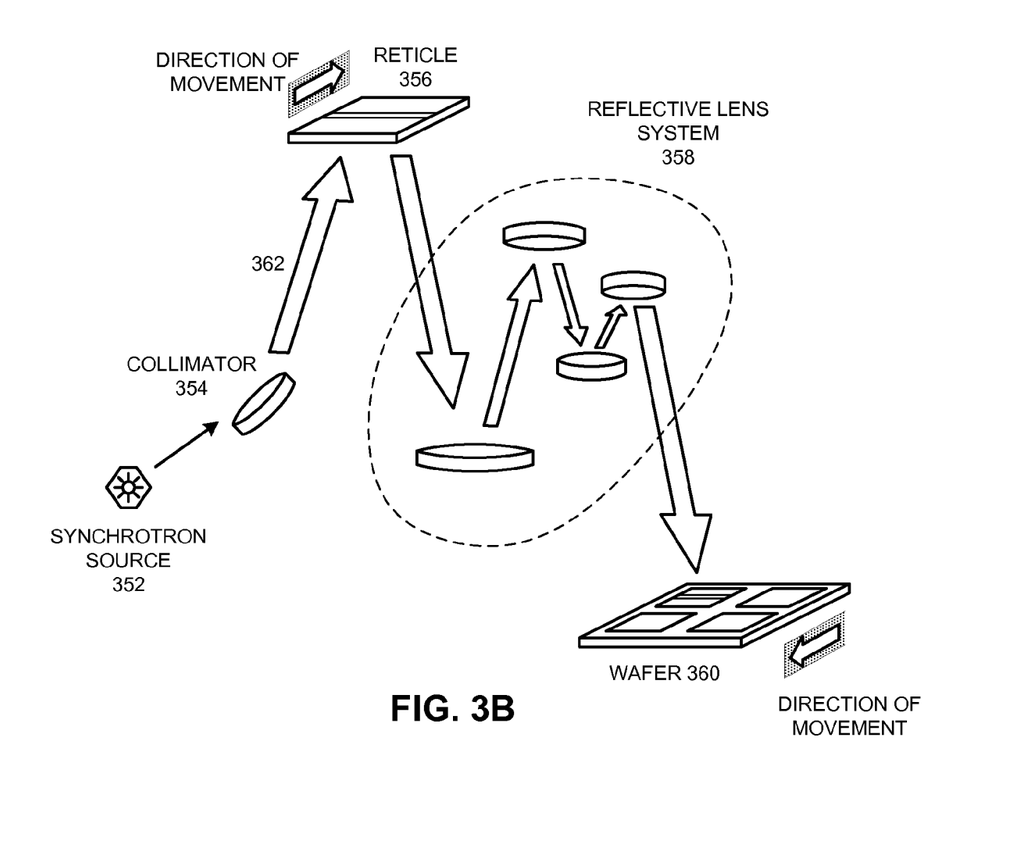
FIG. 3B illustrates an EUVL system which includes a synchrotron source and a step-and-scan stepper in accordance with an embodiment of the present invention.

FIG. 3B illustrates an EUVL system which includes a synchrotron source and a step-and-scan stepper in accordance with an embodiment of the present invention.

Radiation from synchrotron source 352 can be focused and collimated into a flat beam 362 by collimator 354 which uses grazing incidence optics. The flat beam can then be reflected by reticle 356, and by reflective lens system 358, before imaging on wafer 360.

In a step-and-scan approach, the entire area of reticle 356 is not exposed at once. Instead, the step-and-scan stepper uses flat beam 362 to expose a thin section of reticle on wafer 360. By moving reticle 356 and wafer 360 in opposing directions, the step-and-scan stepper can "scan" the reticle patterns onto the wafer one thin section at a time. The flat beam that is used for scanning the reticle is very thin, but it still has a finite width. Hence, to determine the dose at any given point on the wafer, we have to integrate the source intensity across the width of the flat beam.

Note that the reticle typically moves faster than the wafer because the reticle patterns are typically scaled down before they are printed on the wafer. Further, note that the reticle and the wafer have to be moved in substantially perfect synchronization; otherwise, the aerial image will be blurry and the resulting patterns on the wafer will not be of the desired shapes and/or sizes. In fact, the substantially perfect synchronization between the reticle and the wafer has to be maintained even when they are being accelerated or decelerated.

In contrast to an experimental setup, a mass-scale manufacturing system has a substantially lower tolerance to process variations. Specifically, for mass-scale manufacturing, we have to ensure that each point on the wafer is exposed to substantially the same dose.

Using a Synchrotron as a Source in EUVL

Although a synchrotron does not suffer from the drawbacks that commonly used EUVL sources suffer from, using a synchrotron as an EUVL source for mass-scale semiconductor manufacturing poses new challenges. Note that these challenges may not be present in an experimental setup; however, they will be present in a mass-scale manufacturing system due to its substantially low tolerance to process variations, and due to the fact that a mass-scale manufacturing system needs to operate for long durations without any downtime.

A serious problem with a synchrotron is that the electrons lose power when they radiate energy, which causes the beam power to decrease with time.

Figure 4:
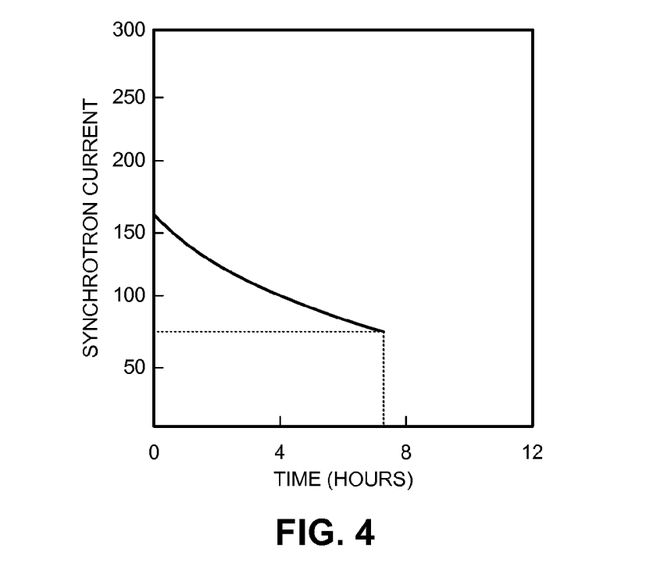
FIG. 4 presents a plot of the synchrotron current against time in accordance with an embodiment of the present invention.

FIG. 4 presents a plot of the synchrotron current against time in accordance with an embodiment of the present invention.

Note that the synchrotron current, which is directly proportional to the beam intensity, has almost halved in less than eight hours. In an experimental setup, this may not be a problem because the system may be used for a short duration in which a few exposures may be taken for experimental purposes. However, if the synchrotron is used as an EUVL source in a mass-manufacturing system, it has to work under much more stringent conditions and for much longer periods. Specifically, for mass-scale semiconductor manufacturing, the dose has to be within a substantially small range of values. Further, the system must operate for a long time before it can be shut down for maintenance purposes, e.g., for injecting a new set of electrons into the storage ring.

Unfortunately, as shown in FIG. 4, the decrease in beam power of a synchrotron can be substantial, and hence, for mass-scale manufacturing, techniques and systems are required to counteract the decrease in the synchrotron's beam power without shutting down the system.

Note that the speed and the number of electrons circulating in the synchrotron determine the current of the circulating electrons. Further, the synchrotron current, i.e., the current created by the circulating electrons, is directly proportional to the beam intensity. Hence, the synchrotron current can be used as a proxy for the beam power.

Further, note that synchrotrons typically already have instrumentation to measure the synchrotron current. One embodiment of the present invention uses the following insight: if we use the synchrotron current to adjust the scan speed of the stepper, we can ensure that each point on the wafer receives substantially the same dose without requiring additional equipment to monitor the beam's intensity.

The beam intensity is directly proportional to the synchrotron current. The dosage is directly proportional to the beam intensity, directly proportional to the exposure duration, and inversely proportional to the scan speed. Hence, to ensure a constant dosage, a step-and-repeat stepper's exposure time can be increased in proportion to the decrease in the synchrotron current. The relationship between the dosage, synchrotron current, and exposure duration can be represented by the following equation:

$$D = k_1 \cdot I \cdot T \quad (1)$$

where, D is the dosage, I is the synchrotron current, T is the exposure duration, and $k_1$ is a proportionality constant which can be determined by calibrating the EUVL system.

During calibration, the synchrotron's current, the step-and-repeat stepper's exposure duration, and the dose can be measured. The measurement data can then be used to determine the proportionality constant. The synchrotron current and the step-and-repeat stepper's exposure time can be measured using appropriate instruments, e.g., an ammeter to measure the current and a clock to measure exposure duration. The dose can be measured directly by measuring the radiation intensity that is received at a point on the wafer's surface. Alternatively, the dose can be measured indirectly by measuring critical dimensions of printed patterns. For example, if the critical dimension of a pattern is known for different doses, the critical dimension data can be used to indirectly determine the dose. Once the proportionality constant, $k_1$, is determined by calibrating the equipment, the exposure duration can be adjusted based on the synchrotron current.

In a step-and-scan stepper, the scan speed can be decreased in proportion to the decrease in the synchrotron current to ensure a constant dose. The relationship between dosage, synchrotron current, and scan speed can be represented by the following equation:

$$D = k_2 \cdot \frac{I}{V}, \quad (2)$$

where D is the dosage, I is the synchrotron current, V is the step-and-scan stepper's scan speed, and $k_2$ is a proportionality constant which can be determined by calibrating the EUVL system.

As with the step-and-repeat stepper, the stepper can be calibrated by measuring the synchrotron's current, the step-and-scan stepper's scan speed, and the dose. Specifically, the step-and-scan stepper's scan speed can be measured using a tachometer which measures the speed of the motor that the step-and-scan stepper uses to move the wafer and the reticle. Once the proportionality constant, $k_2$, is determined by calibrating the equipment, the scan speed can be adjusted based on the synchrotron current.

Note that using the synchrotron current to adjust the exposure time or to adjust the scan speed can obviate the need for expensive equipment to directly monitor the beam intensity. Specifically, one embodiment of the present invention does not use additional monitoring equipment to directly monitor the intensity of the radiation that is being used to expose the wafer.

Figure 5A:
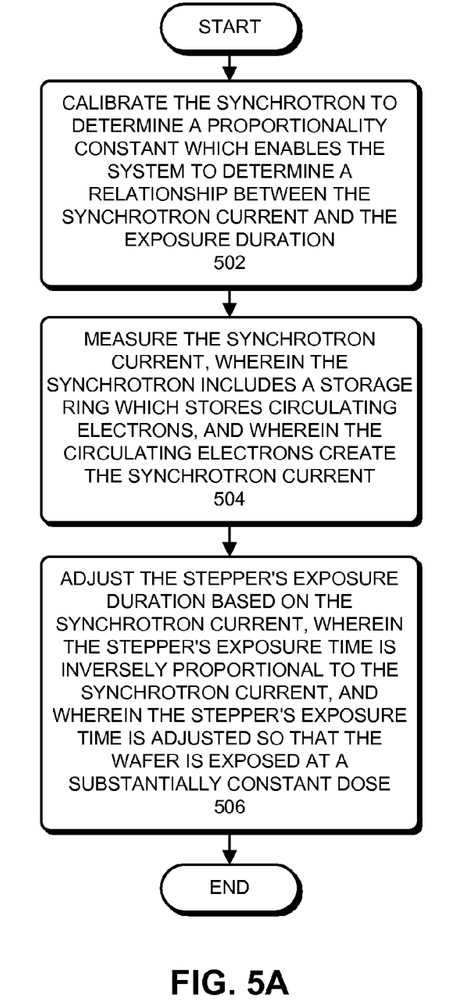
FIG. 5A presents a flowchart that illustrates a process for adjusting the step-and-repeat stepper's exposure time based on the synchrotron current in accordance with an embodiment of the present invention.

FIG. 5A presents a flowchart that illustrates a process for adjusting the step-and-repeat stepper's exposure time based on the synchrotron current in accordance with an embodiment of the present invention.

The process can begin by calibrating the synchrotron to determine a proportionality constant which enables the system to determine a relationship between the synchrotron current and the step-and-repeat stepper's exposure duration (step 502).

For example, Equation (1) gives us the following relationship between the exposure duration T and the synchrotron current I: $T = D/(k_1 \cdot I)$, where $k_1$ is the proportionality constant which can be determined by calibrating the stepper, and D is the constant dose which is to be applied to the wafer.

During operation, the system can measure the synchrotron current, wherein the synchrotron includes a storage ring which stores circulating electrons, and wherein the circulating electrons create the synchrotron current (step 504).

Next, the system can adjust the stepper's exposure duration based on the synchrotron current, wherein the stepper's exposure duration is directly proportional to the synchrotron current, and wherein the stepper's exposure duration is adjusted so that the wafer is exposed to a substantially constant dose (step 506).

Many techniques can be used to adjust the exposure duration. In one embodiment, the exposure duration can be determined by sampling the synchrotron current at different points in time, e.g., at regular time intervals. For example, the synchrotron current can be measured every millisecond. Next, the system can keep track of the aggregate dose that has been applied to the wafer by summing up the incremental doses that were applied to the wafer in each millisecond. Next, the system can terminate the exposure once the aggregate dose reaches a desired level.

Alternatively, measurements of the synchrotron current can be used to predict future values for the synchrotron current, and the exposure duration can be adjusted based on the predicted values. Specifically, if the synchrotron's current is given by the function I(t), the dosage D and exposure time T are related by the equation:

$$D = \int_0^T k_1 \cdot I(t)\, dt. \quad (3)$$

Hence, if we know how the synchrotron current is expected to vary with time, Equation (3) can be used to determine the exposure duration T that will result in the desired dose.

Figure 5B:
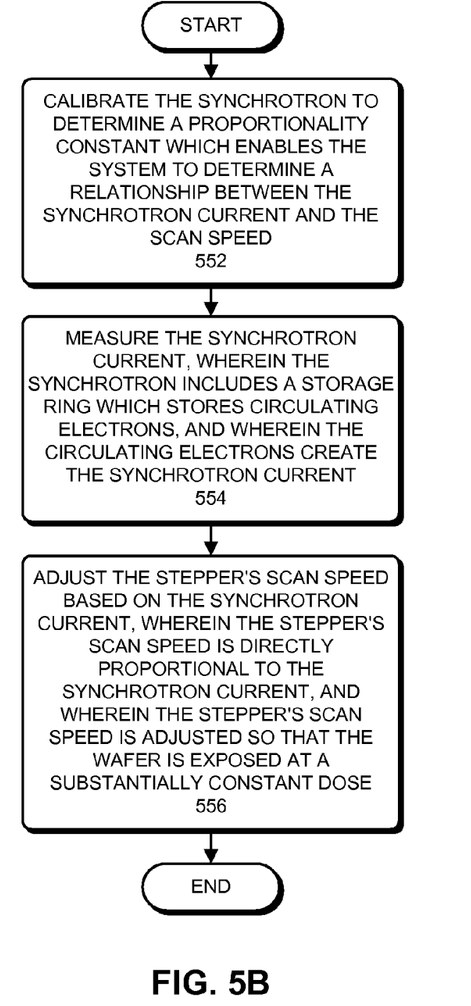
FIG. 5B presents a flowchart that illustrates a process for adjusting the step-and-scan stepper's scan speed based on the synchrotron current in accordance with an embodiment of the present invention.

FIG. 5B presents a flowchart that illustrates a process for adjusting the step-and-scan stepper's scan speed based on the synchrotron current in accordance with an embodiment of the present invention.

The process can begin by calibrating the synchrotron to determine a proportionality constant which enables the system to determine a relationship between the synchrotron current and the step-and-scan stepper's scan speed (step 552). For example, Equation (2) gives us the following relationship between the scan speed V and the synchrotron current I: V=(k/D)·I, where k is the proportionality constant and D is the constant dose which is to be applied to the wafer.

During operation, the system can measure the synchrotron current, wherein the synchrotron includes a storage ring which stores circulating electrons, and wherein the circulating electrons create the synchrotron current (step 554).

Next, the system can adjust the stepper's scan speed based on the synchrotron current, wherein the stepper's scan speed is directly proportional to the synchrotron current, and wherein the stepper's scan speed is adjusted so that the wafer is exposed to a substantially constant dose (step 556).

The stepper's scan speed refers to the synchronized speed at which the stepper moves the reticle and the wafer. Since the reticle's speed and the wafer's speed are substantially perfectly synchronized, we can use the speed of the reticle or the wafer to determine the speed of the other. Specifically, the term "scan speed" can refer to the reticle's speed, the wafer's speed, or to the speed of a motor that the stepper uses to move the reticle and the wafer in a substantially synchronized fashion.

Many techniques can be used to adjust the scan speed. For example, in one embodiment, the scan speed can be adjusted at regular time intervals based on the synchrotron current. For example, the synchrotron current can be measured at each second, and the scan speed can be adjusted accordingly.

Alternatively, the scan speed can be adjusted each time the reticle and/or the wafer moves by a fixed distance. In yet another embodiment, measurements of the synchrotron current can be used to predict future values for the synchrotron current, and the scan speed can be adjusted based on the predicted values. In one embodiment, the stepper changes the scan speed gradually, and during this gradual change, the stepper maintains the substantially perfect synchronization between the reticle's movement and the wafer's movement. Some embodiments can use a control loop feedback mechanism to control the stepper's scan speed. For example, the system can use a P (proportional), a PD (proportional-derivative), a PI (proportional-integral), or a PID (proportional-integral-derivative) controller to gradually change the stepper's scan speed to the desired value.

Figure 6:
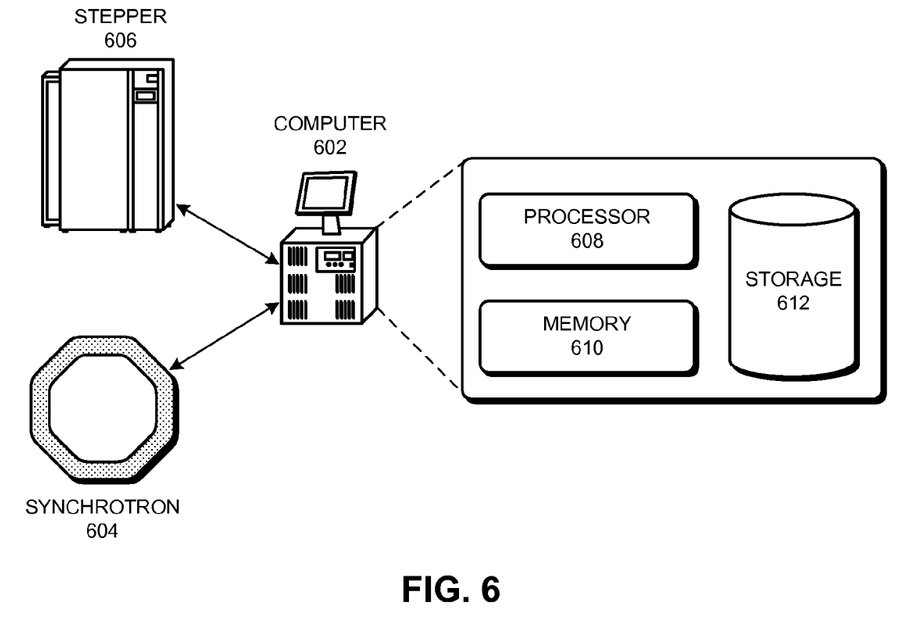
FIG. 6 illustrates how a computer system can be used to control the stepper in accordance with an embodiment of the present invention.

FIG. 6 illustrates how a computer system can be used to control the stepper in accordance with an embodiment of the present invention.

Computer 602 can communicate with synchrotron 604 and stepper 606, which can be a step-and-repeat stepper or a step-and-scan stepper. Specifically, synchrotron 604 can communicate a measurement of the synchrotron current to computer 602. Computer 602 can determine a target exposure-duration or a target scan-speed based on the synchrotron current, and communicate the target exposure-duration or the target scan-speed to stepper 606, which can then adjust its exposure duration or scan speed accordingly.

In one embodiment, stepper 606 can adjust its scan speed so that it matches the target scan speed. In another embodiment, computer 602 can keep track of the dosage that has been applied to the wafer, and when the dosage reaches a desired level, computer 602 can send a message to stepper 606 which causes the stepper to stop exposing the wafer. For example, computer 602 can determine incremental dose values using the synchrotron current measurements that were measured at different points in time. Next, computer 602 can determine an aggregate dose value using the incremental dose values, and compare the aggregate dose value with the substantially constant dose to determine whether the dosage has reached the desired level.

Computer 602 can include processor 608, memory 610, and storage 612. Storage 612 can store instructions for performing the processes illustrated in FIG. 5A and/or FIG. 5B. During operation, these instructions can be loaded in memory 610, and then executed by processor 608, thereby causing computer 602 to perform one or more steps of the processes illustrated in FIG. 5A and/or FIG. 5B.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An extreme ultraviolet lithography (EUVL) system, comprising:
   a synchrotron which is used as a source of extreme ultraviolet radiation, wherein the source's energy decreases with time;
   a stepper which uses a step-and-repeat process to transfer patterns from a reticle onto a wafer, wherein the stepper uses the reticle to expose a region of the wafer, and after exposing the region, the stepper moves the wafer to a new location so that the stepper can expose another region on the wafer, and wherein each region of the wafer is desired to be exposed to a substantially constant dose;
   a computer, which includes a processor and a memory, wherein the memory stores instructions that when executed by the processor cause the computer to:
      receive measurements of a synchrotron current, wherein the synchrotron includes a storage ring which stores circulating electrons which create the synchrotron current, and wherein the measurements are taken at different points in time;
      use the synchrotron current measurements to determine whether the wafer has been exposed to the substantially constant dose, wherein the stepper's exposure duration is inversely proportional to the synchrotron current; and
      in response to determining that the wafer has been exposed to the substantially constant dose, sending a terminate-exposure message to the stepper, which causes the stepper to stop exposing the wafer; and
   wherein the EUVL system is calibrated to determine a proportionality constant k, wherein the substantially constant dose, D, the synchrotron current, I, and the stepper's exposure duration, T, are related by D=k·I·T.

2. The EUVL system of claim 1, wherein the EUVL system includes a collimator to generate a substantially rectangle-shaped beam.

3. The EUVL system of claim 1, wherein using the synchrotron current measurements to determine whether the wafer has been exposed to the substantially constant dose includes:
   determining incremental dose values using the synchrotron current measurements;
   determining an a aggregate dose value using the incremental dose values; and
   comparing the aggregate dose value with the substantially constant dose.

4. The EUVL system of claim 1, wherein using the synchrotron current to control the stepper's exposure duration enables the EUVL system to expose the wafer to the substantially constant dose without using additional equipment capable of monitoring the source's energy.

5. An extreme ultraviolet lithography (EUVL) system, comprising:
   a synchrotron which is used as a source of extreme ultraviolet radiation, wherein the source's energy decreases with time;
   a stepper which uses a step-and-scan process to transfer patterns from a reticle onto a wafer, wherein the stepper moves the reticle and the wafer in a substantially synchronized fashion, albeit at different rates, and wherein the wafer is desired to be exposed to a substantially constant dose;
   a computer, which includes a processor and a memory, wherein the memory stores instructions that when executed by the processor cause the computer to:
      receive a measurement of a synchrotron current, wherein the synchrotron includes a storage ring which stores circulating electrons, and wherein the circulating electrons create the synchrotron current;
      determine a target scan speed based on the measurement of the synchrotron current, wherein the target scan speed is directly proportional to the synchrotron current, and wherein the target scan speed is such that the wafer is exposed to the substantially constant dose; and
      send the target scan speed to the stepper, which causes the stepper to adjust the stepper's scan speed to match the target scan speed; and
   wherein the substantially constant dose, D, the synchrotron current, I, and the stepper's scan speed, V, are related by $$D = k \cdot \frac{I}{V},$$

where k is a proportionality constant which is determined by calibrating the EUVL system.

6. The EUVL system of claim 5, wherein the EUVL system includes a collimator to generate a substantially flat beam, and wherein the collimator uses grazing incidence optics.

7. The EUVL system of claim 5, wherein the stepper's scan speed is adjusted at regular intervals based on the synchrotron current, or each time the reticle moves by a fixed distance.

8. The EUVL system of claim 5, wherein using the synchrotron current to adjust the stepper's scan speed enables the EUVL system to expose the wafer to the substantially constant dose without using additional equipment capable of monitoring the source's energy.

* * * * *